AUTOMATIC GAIN CONTROL CIRCUIT

Filed Nov. 13, 1957

INVENTORS
WALDEMAR G. CHRISTIANSEN &
ALVIN B. GLENN
BY
ATTORNEY 2,987,679

AUTOMATIC GAIN CONTROL CIRCUIT

Waldemar G. Christiansen, Oaklyn, and Alvin B. Glenn, Haddonfield, N.J., assignors to Radio Corporation of America, a corporation of Delaware Filed Nov. 13, 1957, Ser. No. 696,196
2 Claims. (Cl. 330—138)

This invention relates to an automatic gain control (AGC) circuit for an amplifier, and particularly to a delayed automatic gain control circuit.

Although not limited thereto, this invention has particular utility in an amplifier having its input coupled selectively to the output of one of a bank of crystal-controlled oscillators, and having its output coupled to the input of a mixer. This amplifier might, for example, amplify the output of a selected crystal oscillator and feed the amplified signal to a mixer, in a frequency control system for the local oscillator of a communications receiver-transmitter. A communications receiver-transmitter of the type wherein this invention might find application is disclosed in Law Patent No. 2,704,329, dated March 15, 1955. When the mixer is used in a frequency control system such as that disclosed in the aforesaid patent, it is important to maintain the crystal oscillator (reference frequency) voltage on the tube mixer reasonably constant, since the conversion gain of the mixer varies with the crystal oscillator drive, being peaked for a particular value of oscillator drive. The average value of oscillator drive on the mixer should be that corresponding to the peak of the mixer conversion gain, and the oscillator drive voltage should only vary such that the conversion gain variation is about 2 db; this requires that the oscillator drive voltage on the mixer be maintained constant within a ratio of two to one, maximum drive to minimum drive.

In a receiver which tunes to a large number of channels, many crystal-controlled oscillators will be needed. The receiver disclosed in the aforementioned patent, for example, tunes to 1750 channels and requires a total of fifteen crystals. For frequency control purposes, these crystal oscillators should be frequency standards, and oscillators of this type ordinarily have too low a power output to properly operate a mixer, directly. It is therefore necessary to use an amplifier between the crystal controlled oscillator and the mixer. The function of this amplifier is not only to provide a voltage of satisfactory amplitude to the mixer, but to also discriminate against spurious responses from the oscillator. Due to variations in oscillator components such as crystals and tubes, the output of the crystal oscillators can vary by a ratio of as much as four to one; this variation is about two-to-one too large, since, as previously stated, the oscillator drive voltage on the mixer should be maintained constant within a ratio of two to one. In the low amplitude direction, the oscillator drive voltage on the mixer is limited in that it should be large enough to produce a mixer conversion gain which is about 2 db less than the maximum conversion again. In the high amplitude direction, the oscillator drive voltage on the mixer is limited by: (1) mixer conversion gain degradation; (2) harmonics of the oscillator voltage combining in the mixer with harmonics of the signal voltage to give spurious output responses; and (3) tubes drawing grid current, which will degrade the circuit amplitude response.

For the above reasons, it is important to control the amplitude of the oscillator drive voltage applied to the mixer, and this may be conveniently done by means of an amplifier through which the crystal oscillator signal flows, and subjected to AGC acting in response to the amplifier output.

An object of this invention is to provide a novel AGC circuit.

Another object is to provide a novel delayed AGC circuit.

A detailed description of the invention follows, taken in conjunction with the accompanying drawings, wherein.

Figures 1, 2, 3:
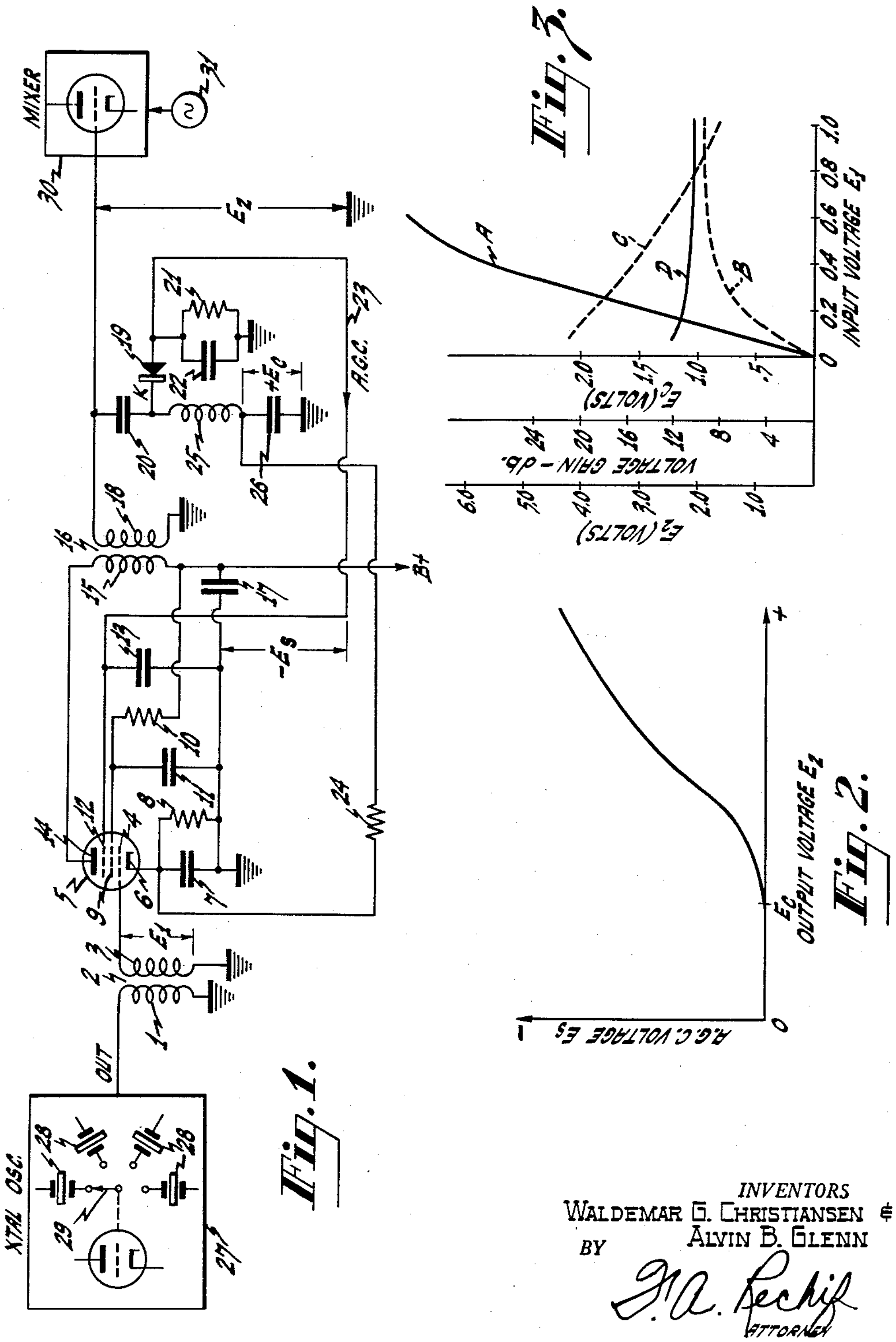
FIG. 1 is a schematic diagram of a circuit arrangement according to this invention.
FIG. 2 is a curve useful in explaining the invention.
FIG. 3 is a set of curves useful in explaining the invention.

Now referring to FIG. 1, a bank of crystal-controlled oscillators 27 (represented by a plurality of crystals 28) has an output connection (labeled "OUT") which is coupled to the primary winding 1 of an input transformer 2. One of the crystals 28 may be selected at a time by means of a switch indicated somewhat schematically at 29. The frequency of the oscillator output signal fed to winding 1 is then determined by the particular crystal selected by switch 29. The individual output amplitudes of the various crystals may vary over a wide range; for example, there may be a ratio of about four to one between the largest and smallest oscillator amplitudes. The arrangement 27 may comprise either a bank of crystals (as at 13 in the aforementioned Law patent), or a bank of tuned circuits (as at 4 in said patent). The voltage $E_1$ across the secondary winding 3 of transformer 2 may be considered the input voltage to the amplifier of this invention. One end of secondary winding 3 is connected to a point of zero signal potential, such as ground, and the other end of this winding is connected to the control grid 4 of a pentode vacuum tube 5, which for example may be of the 5636 type. The amplifier input voltage $E_1$ is therefore that applied to control grid 4, i.e. between this grid and ground.

The cathode 6 of electron discharge device 5 is connected to ground (which is preferably the negative terminal of the unidirectional power supply, as well as the point of zero signal potential) through a resistance-capacitance self-biasing network comprising a capacitor 7 and a resistor 8 connected in parallel. The cathode current flowing through resistor 8 develops a voltage at cathode 6 which is positive with respect to ground and which is denoted by $+E_c$. This is the bias voltage for tube 5.

The screen grid 9 of tube 5 is connected to the positive terminal B+ of the unidirectional power supply through a resistor 10, and is bypassed to ground by way of a capacitor 11. The suppressor grid 12 of tube 5 is bypassed to ground by way of a capacitor 13, and an AGC voltage is applied thereto, in a manner to be described hereinafter.

The anode 14 of tube 5 is connected through the primary winding 15 of an output transformer 16 to the positive terminal B+ of the power supply, and is bypassed to ground by way of a capacitor 17, which desirably may be a feed-through capacitor. Tube 5 is thus suitably energized to act as an amplifier. One end of the secondary winding 18 of transformer 16 is connected to ground, while the other end serves as the ungrounded output terminal of the amplifier disclosed, and is connected to supply the amplifier output to one input of a mixer 30. The voltage $E_2$ across the winding 18, or between the ungrounded end of this winding and ground, may be considered the output voltage of the amplifier of this invention.

The other of the two inputs to mixer 30 is coupled to the output of an alternating current source schematically illustrated at 31. Source 31 may be provided, for example, by sampling the output of a variable frequency oscillator which is arranged to be controlled by means of a frequency control system in which the AGC circuit of this invention may be included. On the other hand, source 31 may represent the output of a preceding mixer in which the variable frequency oscillator output has been heterodyned or mixed with a stable, crystal-controlled reference frequency wave.

The output voltage of the crystal oscillator is applied to the grid 4 of the amplifier tube 5 through the input transformer 2. This voltage (the amplifier input voltage $E_1$) can vary by as much as four to one. However, from the previous discussion, the output voltage $E_2$ should not vary by more than two to one, within the optimum minimum and maximum limits for conversion gain of the mixer. In order to accomplish this, a diode detector (AGC detector) 19 is coupled by means of a capacitor 20 to the anode or amplifier output circuit, in such a way as to develop a unidirectional voltage (AGC voltage) proportional to the amplifier output. The diode may be a type 1N251, for example. The diode 19 has its cathode (denoted by the symbol K) connected to capacitor 20, in order to develop a negative voltage (denoted by $-E_s$) across the AGC diode load which comprises a resistor 21 and a capacitor 22 connected in parallel, the parallel combination being connected between the anode of diode 19 and ground. Thus, the AGC voltage $-E_s$ appears between the AGC lead 23 (connected to the anode of diode 19 and the upper end of the combination 21, 22) and ground.

In order to meet the requirements discussed hereinabove, it is necessary for the AGC circuitry to be of the so-called delayed type. The voltage needed for the delay of the AGC is the voltage $+E_c$ on the cathode 6, this positive voltage being applied through a resistor 24 and a suitable choke 25 to the cathode of diode 19. This will provide a back bias or reverse bias on the diode, such that it does not conduct unless or until the amplifier output voltage $E_2$ is sufficient to overcome the delay voltage. When the amplifier output voltage $E_2$ exceeds the bias voltage $E_c$, diode 19 conducts to develop a unidirectional voltage which is negative with respect to ground and which is proportional to the amplifier output $E_2$. The delayed AGC voltage $E_s$ (on lead 23) will thus follow the curve shown in FIG. 2, beginning at the "delay point" $E_c$ and becoming increasingly negative as the output voltage $E_2$ increases.

A bypass capacitor 26 is connected from that end of choke 25 remote from the diode cathode, to ground.

In order to prevent detuning of the input circuit 2, etc. with variations of AGC voltage or bias, the AGC voltage developed by diode 19 is supplied to the suppressor grid 12, instead of to the control grid 4. Thus, the lead 23 couples the AGC voltage $-E_s$ directly to suppressor grid 12. The gain of an amplifier tube may be controlled by varying the (negative) voltage applied to the suppressor grid thereof. This is what is done according to this invention, the AGC potential $-E_s$ developed by diode 19 being applied to suppressor grid 12 to vary the amplifier gain inversely with the strength of the input signal $E_1$, that is, to minimize the changes in amplifier output $E_2$ which occur when the amplifier input $E_1$ changes. In use, the bias voltage $E_c$ is adjusted to provide the smallest change in amplifier output $E_2$ for the maximum change in the amplifier input $E_1$.

FIG. 3 is a set of curves showing the results of tests on actual circuits. The solid-line curve A illustrates the voltage output characteristic of an ordinary amplifier, without AGC according to this invention. This curve shows that, without AGC, the amplifier output voltage $E_2$ increases steeply as the input voltage $E_1$ increases. The dashed-line curve B illustrates the voltage output characteristic of an amplifier with delayed AGC according to this invention. Curve B shows that, with this invention, the amplifier output voltage $E_2$ flattens out and is held much more nearly constant as the input voltage $E_1$ increases. From a comparison of curves A and B, it may be seen that the amplifier output voltage, when using the circuit of this invention, does not vary over nearly as great a range as without the circuit of the invention.

The dashed-line curve C represents the variation of voltage gain of the amplifier of the invention, with variation of amplifier input voltage $E_1$. Curve C shows that the amplifier voltage gain falls off markedly as the input voltage $E_1$ increases. This action is due to the development by diode 19 of an AGC voltage which increases negatively as the amplifier output voltage increases, and to the use of this voltage to vary the amplifier gain inversely with the strength of the input voltage $E_1$. The fact that the amplifier gain decreases as the input voltage $E_1$ rises or increases means that the output voltage $E_2$ tends to be maintained more nearly constant as the input voltage rises.

As previously described, the (AGC) voltage on the suppressor grid 12 increases negatively as the amplifier input voltage (or the amplifier output voltage) increases. As the suppressor grid voltage increases negatively, the screen grid current in tube 5 will increase and the anode current will decrease, with the cathode current remaining essentially constant. Since the cathode current is constant, the cathode voltage $E_c$ (used as a delay bias for the AGC diode 19) obtained across the cathode resistor 8 is constant. As previously stated, the cathode voltage $E_c$ is also the bias for the amplifier tube 5 itself. Curve D in FIG. 3 illustrates the variation of bias voltage $E_c$ with variation of amplifier input voltage $E_1$; this curve is essentially horizontal, showing that the cathode voltage $E_c$ is essentially constant with variations of amplifier input voltage $E_1$.

It has been stated that the screen grid current in tube 5 increases as the suppressor grid voltage increases negatively. The increase in screen grid current results in a decrease in screen grid voltage, because of the increased voltage drop across the screen grid resistor 10. This decrease in screen grid voltage (as the suppressor grid voltage increases negatively due to rising amplifier output) is in the proper direction to provide an additional gain control (since it tends to decrease the amplifier gain as the amplifier output increases), but this is a second order effect.

The following values for certain of the circuit constants are given by way of example only. These values were those used in an amplifier constructed according to this invention and successfully tested. The amplifier operated at 40 mc.

| | | |
|---|---|---|
| Resistor 8 | ohms | 150 |
| Resistor 10 | do | 6800 |
| Resistor 21 | do | 100,000 |
| Resistor 24 | do | 1200 |
| Capacitor 20 | mmfd | 25 |
| Capacitor 22 | mmfd | 100 |
| Anode supply voltage | volts | 120 |

What is claimed is:

1. An amplifier circuit comprising an electron discharge device amplifier having at least a control grid, a suppressor grid, an anode and a cathode, means for supplying an input signal to said control grid, a cathode circuit including a resistor connected to said cathode and a point of zero signal potential in said amplifier circuit, a capacitor connected across said resistor, an anode circuit connected to said anode and including the primary of a transformer therein, a secondary coupled to said primary for developing an output voltage, an output connection from said secondary, a rectifier having a cathode and an anode for developing a unidirectional voltage proportional to the output of said amplifier, capacitor means coupling the cathode of said rectifier to said output connection, a direct current biasing connection between said cathode of said discharge device amplifier and said cathode of said rectifier so that the potential at said electron discharge device cathode is effective on said rectifier, a capacitor connected between said anode of said rectifier and said point of zero signal potential, and means for applying said unidirectional voltage from said anode of said rectifier to said suppressor grid to vary the gain of said amplifier inversely with the strength of said input signal.

2. An amplifier circuit comprising an electron discharge device amplifier having at least a control grid, and a second grid capable of exercising a control function, an anode and a cathode, means for supplying an input signal to said control grid, a cathode circuit including a resistor connected to said cathode and a point of zero signal potential in said amplifier circuit, a capacitor connected across said resistor, an anode circuit connected to said anode and including the primary of a transformer therein, a secondary coupled to said primary for developing an output voltage, an output connection from said secondary, a rectifier having a cathode and an anode for developing a unidirectional voltage proportional to the output of said amplifier, capacitor means coupling the cathode of said rectifier to said output connection, a direct current biasing connection between said cathode of said discharge device amplifier and said cathode of said rectifier so that the potential at said electron discharge device cathode is effective on said rectifier, a capacitor connected between said anode of said rectifier and said point of zero signal potential, and means for applying said unidirectional voltage from said anode of said rectifier to said second grid to vary the gain of said amplifier inversely with the strength of said input signal.

References Cited in the file of this patent

UNITED STATES PATENTS

| | | |
|---|---|---|
| 1,980,581 | Goddard | Nov. 13, 1934 |
| 2,144,015 | Foster | Jan. 17, 1939 |
| 2,250,559 | Weber | July 29, 1941 |
| 2,285,896 | Brown | June 9, 1942 |
| 2,428,039 | Royden | Sept. 30, 1947 |
| 2,552,586 | Read et al. | May 15, 1951 |
| 2,611,081 | Spenser | Sept. 16, 1952 |
| 2,617,037 | Hugenholtz | Nov. 4, 1952 |
| 2,662,125 | Stafford | Dec. 8, 1953 |
| 2,857,481 | Philips | Oct. 21, 1958 |

FOREIGN PATENTS

| | | |
|---|---|---|
| M14969(VIIIa/21a1) | Germany | Aug. 16, 1956 |